US011208003B2

(12) United States Patent
Heyne et al.

(10) Patent No.: US 11,208,003 B2
(45) Date of Patent: Dec. 28, 2021

(54) METHOD AND CHARGING DEVICE FOR DETERMINING A MAXIMUM STORAGE CAPACITY OF AN ENERGY STORE

(71) Applicant: Dr. Ing. h.c. F. Porsche Aktiengesellschaft, Stuttgart (DE)

(72) Inventors: Raoul Heyne, Wiernsheim (DE); Dominik Volk, Karlsruhe (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 99 days.

(21) Appl. No.: 16/815,112

(22) Filed: Mar. 11, 2020

(65) Prior Publication Data
US 2020/0290472 A1 Sep. 17, 2020

(30) Foreign Application Priority Data
Mar. 12, 2019 (DE) ...................... 10 2019 106 240.3

(51) Int. Cl.
| | |
|---|---|
| *H02J 7/00* | (2006.01) |
| *B60L 53/62* | (2019.01) |
| *G01R 31/385* | (2019.01) |
| *G01R 31/392* | (2019.01) |
| *G01R 31/374* | (2019.01) |
| *B60L 50/60* | (2019.01) |
| *B60L 58/12* | (2019.01) |
| *B60L 53/31* | (2019.01) |
| *G01R 31/382* | (2019.01) |
| *B60L 55/00* | (2019.01) |
| *H01M 10/44* | (2006.01) |

(Continued)

(52) U.S. Cl.
CPC ............... *B60L 53/62* (2019.02); *B60L 50/66* (2019.02); *B60L 53/31* (2019.02); *B60L 55/00* (2019.02); *B60L 58/12* (2019.02); *G01R 31/374* (2019.01); *G01R 31/382* (2019.01); *G01R 31/385* (2019.01); *G01R 31/392* (2019.01); *H01M 10/44* (2013.01); *H02J 7/0048* (2020.01); *H02J 7/342* (2020.01); *B60L 53/18* (2019.02); *Y02T 90/12* (2013.01)

(58) Field of Classification Search
CPC .......... B60L 53/62; B60L 55/00; B60L 50/66; B60L 58/12; B60L 53/31; B60L 53/18; G01R 31/382; G01R 31/385; G01R 31/392; G01R 31/374; H01M 10/44; H02J 7/0048; Y02T 90/12
USPC ........................... 320/103, 109, 127; 701/22
See application file for complete search history.

(56) References Cited

U.S. PATENT DOCUMENTS

| | | |
|---|---|---|
| 2011/0313613 A1 | 12/2011 | Kawahara et al. |
| 2012/0004798 A1 | 1/2012 | Sakamoto et al. |

(Continued)

*Primary Examiner* — Zixuan Zhou
(74) *Attorney, Agent, or Firm* — RatnerPrestia

(57) ABSTRACT

A method for determining a maximum storage capacity of an energy store, in particular as a drive battery of a vehicle with an electrical drive, including the steps of determining a state of charge of the energy store of the vehicle, charging the energy store until it reaches its maximum amount of charge, completely discharging the energy store using a separate energy storage unit for receiving the charge of the energy store, wherein an amount of charge transferred from the energy store to the energy storage unit is captured, and outputting the transferred amount of charge upon complete discharging of the energy store as the maximum capacity of the energy store.

15 Claims, 2 Drawing Sheets

Figure 1:
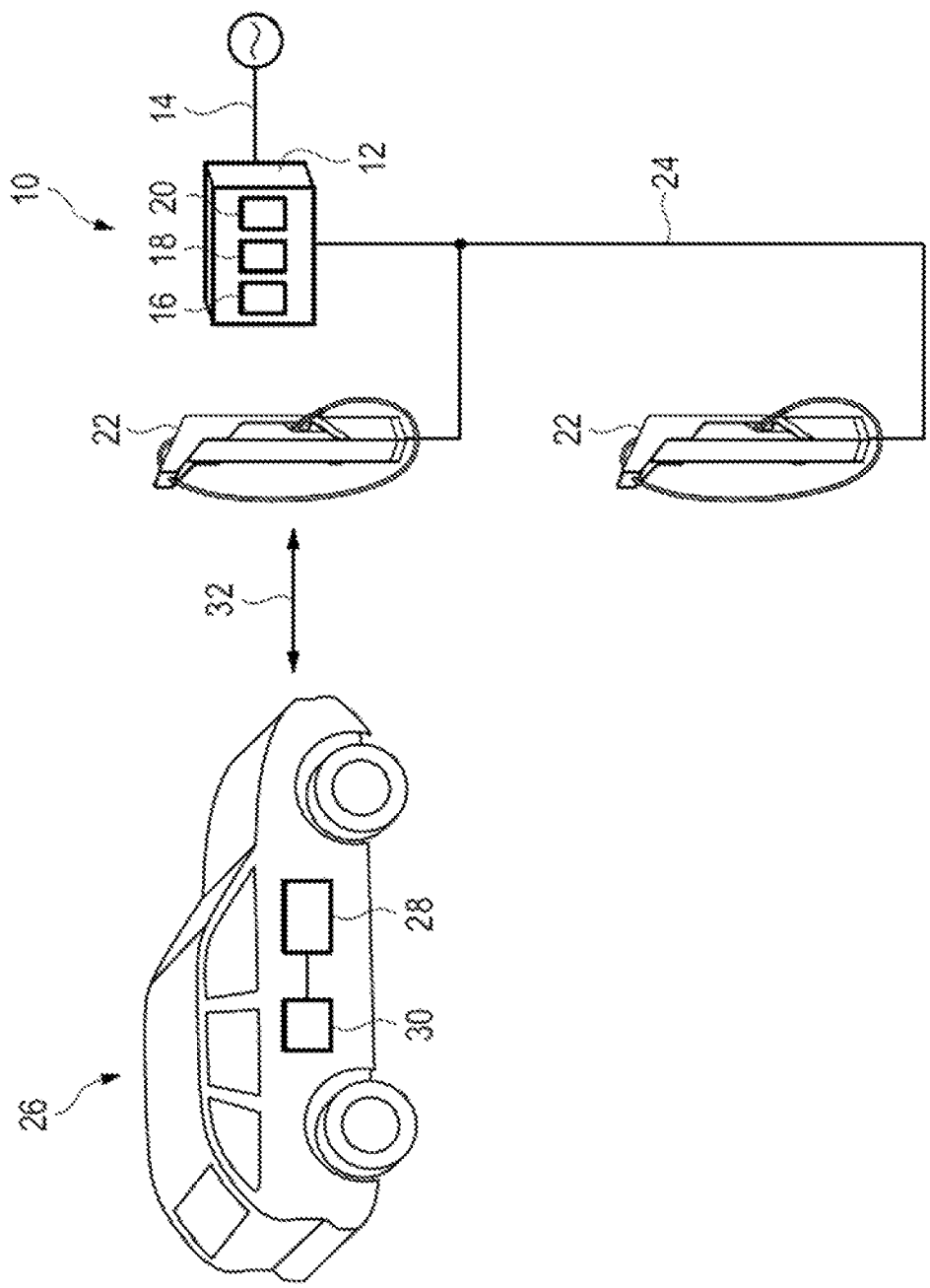

(51) Int. Cl.
*H02J 7/34* (2006.01)
*B60L 53/18* (2019.01)

(56) References Cited

U.S. PATENT DOCUMENTS

| | | |
|---|---|---|
| 2013/0124029 A1 | 5/2013 | Izumi |
| 2015/0081122 A1 | 3/2015 | Yonetani |
| 2016/0288648 A1* | 10/2016 | Klapper .................. B60L 53/14 |
| 2017/0113564 A1* | 4/2017 | Unno ...................... B60L 58/20 |
| 2020/0047634 A1* | 2/2020 | Akaishi ................... B60L 58/20 |

* cited by examiner

METHOD AND CHARGING DEVICE FOR DETERMINING A MAXIMUM STORAGE CAPACITY OF AN ENERGY STORE

CROSS-REFERENCE TO RELATED APPLICATION

This application claims priority to German Patent Application No. 10 2019 106 240.3, filed Mar. 12, 2019, the content of such application being incorporated by reference herein in its entirety.

FIELD OF THE INVENTION

The present invention relates to a method for determining a maximum storage capacity of an energy store, in particular as a drive battery of a vehicle with an electrical drive.

BACKGROUND OF THE INVENTION

The invention also relates to a charging device for the fast-charging of an energy store, in particular as a drive battery of a vehicle with an electrical drive, comprising a charging pole, and a charge box which is connected between an energy network and the charging pole and provides the charging pole with electrical energy for fast-charging with high DC voltages and direct currents, wherein the charge box can have an energy storage unit, and the charging device is configured to carry out the above method.

The present invention relates, in particular, to the field of the fast-charging of vehicles having an electrical drive with high DC voltages and direct currents, where high electrical powers are provided for the fast-charging of electric vehicles. The fast-charging is carried out, for example, using a so-called charge box (CBX). The CBX, for example together with one to two connectable charging poles, is a "small charging solution".

In this case, the CBX comprises, for example, one to two power electronic units and a cooling unit. The CBX can also have an internal energy storage unit. The energy storage unit can be used, for example, as a booster in order to accelerate the charging of the vehicles. Accordingly, the internal energy storage unit can be charged with low powers from an energy network in order to provide, in the charged state, a higher power, as a combination of network and battery power, for charging the vehicles.

The various charging stations which are used throughout the world often have low charging powers and usually obtain the latter directly from the energy network.

Electric vehicles have a battery as an energy store, in which case it may be necessary or at least desirable to check the capacity of the battery. The battery needs to be completely charged and discharged for this purpose. However, this is very complicated and is associated with high costs. However, the maximum capacity of the battery can change over time as a result of aging effects, with the result that it is desirable to check the maximum capacity of the battery.

The maximum capacity of the batteries of vehicles with electrical drives is therefore often determined on the basis of driving data. However, it is not possible to completely and accurately determine the capacity. An accurate test of the capacity of batteries is possible with a test bench, for which purpose the batteries typically have to be removed. Only in this manner can the batteries be reliably measured. The energy stored in the vehicle battery is usually fed back into the energy network in this case.

In this context, US 2011 313 613 A1, which is incorporated by reference herein in its entirety, discloses an electrical storage apparatus having a state capture unit which manages and controls the state of a battery unit. The state capture unit captures an inter-terminal voltage of each individual battery of a multiplicity of batteries, which is measured by a battery management unit in a no-load state in which the battery unit is disconnected from a load, and calculates variation information relating to the states charge of the batteries. In addition, the state capture unit calculates, taking into account the variation information relating to the states of charge of the batteries, permissible charging and discharging information which is needed to control the charging and discharging of the battery unit in a charged state. For this purpose, the battery unit is connected to a load and is charged or discharged and outputs the permissible charging and discharging information to a charging and discharging device in the battery unit.

According to US 2012 004 798 A1, which is incorporated by reference herein in its entirety, a discharge control apparatus in an electric motorcycle comprises a main battery, a motor which is driven on the basis of the electrical energy provided by the main battery, and a lighting apparatus which is a load other than the motor for converting electrical energy. A BMU determines a remaining capacity of the main battery. A control element carries out discharge control of the main battery in order to supply the motor and the lighting apparatus with electrical energy. The BMU and the control element allow the main battery to be discharged until the remaining capacity becomes a threshold value of greater than zero. If the control element receives an instruction to check a deterioration state of the main battery from an external test device, the control element discharges the main battery until the remaining capacity reaches zero, and the main battery can then be completely charged in order to determine a chargeable capacity.

US 2013 124 029 A1, which is incorporated by reference herein in its entirety, relates to control for a vehicle having a battery, a load, an electronic power controller which controls the electrical power exchanged between the battery and the load, and a charging device which charges the battery using a power supply outside the vehicle. The control comprises controlling the electrical power controller such that an SOC, the ratio of actual charge to the full charging capacity, falls in a predetermined range; controlling the electrical power controller and the charging device, if the power supply is connected to the vehicle, such that extended charging is carried out, during which a variation in the SOC during external charging is greater than a width of the predetermined range; and calculating the full charging capacity by multiplying a ratio of a maximum value of the SOC to a variation in the SOC during the extended charging by an accumulated value of the current flowing into the battery during the extended charging.

US 2015 081 122 A1, which is incorporated by reference herein in its entirety, relates to a method for reducing the peak energy consumption of a power consumer. The method comprises pre-programming an actual consumption power on the basis of the actual power consumption, wherein the actual consumption power has a peak start time, a peak end time and a peak consumption time; determining a connection period of a battery of a vehicle to the charging station of the power consumer; determining an available energy between the required departure energy of the battery and the connection energy; determining an average expected consumption power which averages the actual power consumption over the connection period; and determining a charging/ discharging line by setting the average expected consumption power on the basis of the available energy and the connection period.

According to US 2016 288 648 A1, which is incorporated by reference herein in its entirety, in order to test a traction battery of an electric vehicle, which can be both charged and discharged via a charging/discharging interface, a control command is generated for the purpose of initiating a discharging operation of the traction battery. The discharging operation is monitored by a test device. At least one characteristic variable of the traction battery is determined on the basis of the monitored discharging operation.

SUMMARY OF THE INVENTION

On the basis of the above-mentioned prior art, described herein is a method and a charging device of the above-mentioned type which make it possible to easily and reliably determine a maximum storage capacity of an energy store, in particular as a drive battery of a vehicle with an electrical drive, of the above-mentioned type.

Described herein is a method for determining a maximum storage capacity of an energy store, in particular as a drive battery of a vehicle with an electrical drive, comprising the steps of determining a state of charge of the energy store of the vehicle, charging the energy store until it reaches its maximum amount of charge, completely discharging the energy store using a separate energy storage unit for receiving the charge or at least part of the charge of the energy store, wherein an amount of charge transferred from the energy store to the energy storage unit, for example, is captured, and outputting the transferred amount of charge upon complete discharging of the energy store as the maximum capacity of the energy store. The output may be a numerical value, for example.

A charging device for the fast-charging of an energy store, in particular as a drive battery of a vehicle with an electrical drive, comprises a charging pole, and a charge box which is connected between an energy network and the charging pole and provides the charging pole with electrical energy for fast-charging with high DC voltages and direct currents, wherein the charge box has an energy storage unit, and the charging device is configured to carry out the above method.

According to one aspect, described is a method of calculating the maximum capacity of an energy store by completely discharging the completely charged energy store, wherein charge from the energy store can be buffered by the energy storage unit. With complete discharging of the energy store, the maximum capacity of the energy store can be determined in a particularly reliable manner in comparison with other methods which only estimate the maximum capacity of the energy store on the basis of charging and/or discharging characteristics. In this case, the method can also be carried out in a particularly cost-effective manner since, on account of the energy storage unit, the electrical charge from the energy store generally does not have to be discharged or converted in another manner, but rather buffering can be carried out. In addition, both the charging and the discharging can be carried out in a particularly short time since the energy storage unit can be used as a booster both for the charging and for the discharging of the energy store if only a small network connection (that is to say with a low charging power) is available, for example.

The maximum capacity of the energy store is determined by means of an energy flow during the discharging of the energy store. For example, a discharge current and a discharge voltage are measured, as a result of which the discharged amount of energy can be determined and the maximum capacity of the energy store can therefore be inferred. The measurement can be carried out in the charge box. Alternatively or additionally, a DC meter installed in the charging pole can be used, for example, to measure the discharge current and the discharge voltage as immediately as possible and in a calibrated manner.

In order to ensure that the maximum storage capacity of the energy store can be correctly determined, it is necessary for the energy store to always be discharged from a state of full charge. Therefore, the state of charge of the energy store of the vehicle is first of all determined, so that the energy store can be charged until it reaches its maximum amount of charge.

The energy store is, in particular, a drive battery of an electrically drivable vehicle. The vehicle may have solely an electrical drive or, as a so-called hybrid vehicle, can additionally have an internal combustion engine, for example. The energy store may have any desired number of individual battery cells which are connected in parallel and/or in series in a desired manner in order to achieve, for example, a desired combination of maximum voltage, maximum current and maximum storage capacity.

The charging device is designed for fast-charging with DC voltage and direct current. The charging device comprises one or more charging poles which is or are supplied with electrical energy by the charge box for fast-charging with high DC voltages and direct currents. During use, for example in the home area, a plurality of vehicles can thus be connected to the charging device, for example, and can be charged together in a parallel manner or in succession overnight, for example. Accordingly, the charging device can be connected to a home network as the energy network.

The connection to the energy network is effected via the charge box. The energy storage unit of the charge box may have any desired number of individual battery cells which are connected in parallel and/or in series in a desired manner in order to achieve, for example, a desired combination of maximum voltage, maximum current and maximum storage capacity. The energy storage unit preferably has a maximum capacity which is greater, for example 50% or 100% greater, than the maximum possible capacity of the energy store. In this case, an average maximum capacity of the energy store can be assumed, for example. In the home area in particular, if the same vehicle or vehicles is/are always charged, the energy storage unit can be accordingly adapted to the energy store(s) of this/these vehicle(s). The energy storage unit of the charge box is used, on the one hand, as a booster in order to charge and/or discharge the energy store with a power which is increased in comparison with the network connection alone. Alternatively or additionally, the energy storage unit of the charge box can be used to buffer energy for charging the energy store, for example. This may be useful if the availability of electrical energy and/or a price of the available electrical energy is/are subject to fluctuations. The energy store can therefore always be charged with favorable electrical energy.

In an advantageous configuration of the invention, the method comprises an additional step for charging the energy store using the separate energy storage unit for delivering charge to the energy store. The energy store is completely discharged after determining the maximum capacity during discharging, with the result that the energy store is preferably charged again immediately after determining the maximum capacity during discharging, with the result that the vehicle can be used again and the maximum capacity is also determined when charging the vehicle. In order to be able to carry out the charging as cost-effectively as possible, electrical energy is preferably transferred from the energy storage unit to the energy store, which energy storage unit has preferably been previously charged with this energy during discharging of the drive battery.

In an advantageous configuration of the invention, the method comprises an additional step for discharging the separate energy storage unit, in particular for charging the energy store. As a result, charge stored in the energy storage unit can be used to charge the energy store, with the result that the latter can be completely charged. Ideally, it is possible to completely dispense with feeding electrical energy stored in the energy storage unit back into the connected energy network. In addition, as a result of the previous discharging of the energy storage unit, the energy store can be completely or largely discharged into the energy storage unit. The method can therefore be carried out in a particularly cost-effective manner. The separate energy storage unit can be discharged at the same time as the charging of the energy store if the energy from the energy storage unit is transferred to the energy store while the latter is completely charged.

In an advantageous configuration of the invention, the charging and/or the complete discharging of the energy store using a separate energy storage unit for receiving/delivering the charge of the energy store comprise(s) charging/discharging the energy store according to a defined charging/discharging profile. This makes it possible to ensure that the energy store is reliably charged/discharged and its maximum capacity can be correctly determined. Damage to the energy store during charging/discharging can be avoided. At the same time, the method can be carried out efficiently since unnecessary time losses as a result of uncontrolled discharging of the energy store are prevented.

In an advantageous configuration of the invention, the energy store is charged and/or discharged according to a defined charging/discharging profile, for example charging/discharging at a ⅓ C rate. This discharging/charging profile has already proved itself as such in practice. The charging/discharging is carried out at a third of the maximum capacity per hour, with the result that the complete charging/discharging of the energy store can be completed after three hours. It goes without saying that other charging/discharging profiles can also be used.

A C-rate is a measure of the rate at which a battery is discharged relative to its maximum capacity. For example, a 1 C rate means that the discharge current will discharge the entire battery in 1 hour. For a battery with a capacity of 100 Amp-hrs, this equates to a discharge current of 100 Amps.

In an advantageous configuration of the invention, the complete discharging/charging of the energy store using a separate energy storage unit for receiving/delivering the charge of the energy store comprise(s) discharging/charging the energy store taking into account the temperature. For this purpose, the vehicle or only the energy store can be brought to a suitable temperature, for example, in order to be able to reliably determine the maximum capacity. Accordingly, the temperature of the vehicle or of the energy store can be preconditioned. The energy store can be preconditioned, for example, using a battery management unit (BMU) of the vehicle by virtue of the charging device accordingly communicating with said unit.

In an advantageous configuration of the invention, the complete discharging of the energy store using a separate energy storage unit for receiving the charge of the energy store comprises transferring charge from the energy storage unit to an energy network, in particular a local home energy network, and/or directly transferring charge of the energy store to an energy network. The method can therefore also be carried out if the energy storage unit has a lower capacity than the energy store. The method for determining the maximum capacity of the energy store can also already be carried out without previously discharging the energy storage unit. In this case, the use of the electrical energy in the local home network is preferred in order to avoid feeding electrical energy back into the energy network.

In an advantageous configuration of the invention, the complete discharging of the energy store using a separate energy storage unit for receiving the charge of the energy store comprises converting energy from the energy storage unit via a consumer and/or directly converting energy of the energy store via a consumer. The consumer may be an auxiliary consumer of the charging device which is usually supplied via the energy network. The consumer may also be an internal consumer, for example a cooling unit of the charging device. A consumer in a home network can also be supplied with the energy from the energy storage unit. The method can therefore also be carried out if the energy storage unit has a lower capacity than the energy store. The method for determining the maximum capacity of the energy store can also already be carried out without previously discharging the energy storage unit.

In an advantageous configuration of the invention, the determination of a state of charge of the energy store of the vehicle comprises measuring the state of charge of the energy store or requesting the state of charge of the energy store from a management unit of the energy store. The state of charge can be measured, for example, via the charging pole. The state of charge is requested by means of communication with the management unit. The management unit is typically also referred to as a BMU.

In a further configuration of the invention, the energy store can be discharged directly into the energy network and/or can be charged directly from the energy network. This can be carried out, for example, when the energy storage unit is full, empty or defective.

In a further configuration of the invention, the energy store can be discharged in a parallel manner into the energy network and the energy storage unit and/or can be charged in a parallel manner from the energy network and the energy storage unit.

In a further configuration of the invention, it is possible to carry out the renewed charging of the energy store from the energy storage unit until it reaches its maximum amount of charge.

In a further configuration of the invention, the method can also comprise determining the amount of charge transferred during the renewed charging as a maximum charging capacity and outputting a maximum capacity of the energy store on the basis of the maximum charging capacity and the amount of charge transferred during complete discharging of the energy store (discharging capacity). For example, the maximum charging capacity and the discharging capacity can be output as individual values, their mean value and their differences.

The invention is explained by way of example below on the basis of preferred exemplary embodiments with reference to the attached drawings, wherein the features described below can represent an aspect of the invention both individually in each case and in combination.

BRIEF DESCRIPTION OF THE DRAWING FIGURES

Figure 2:
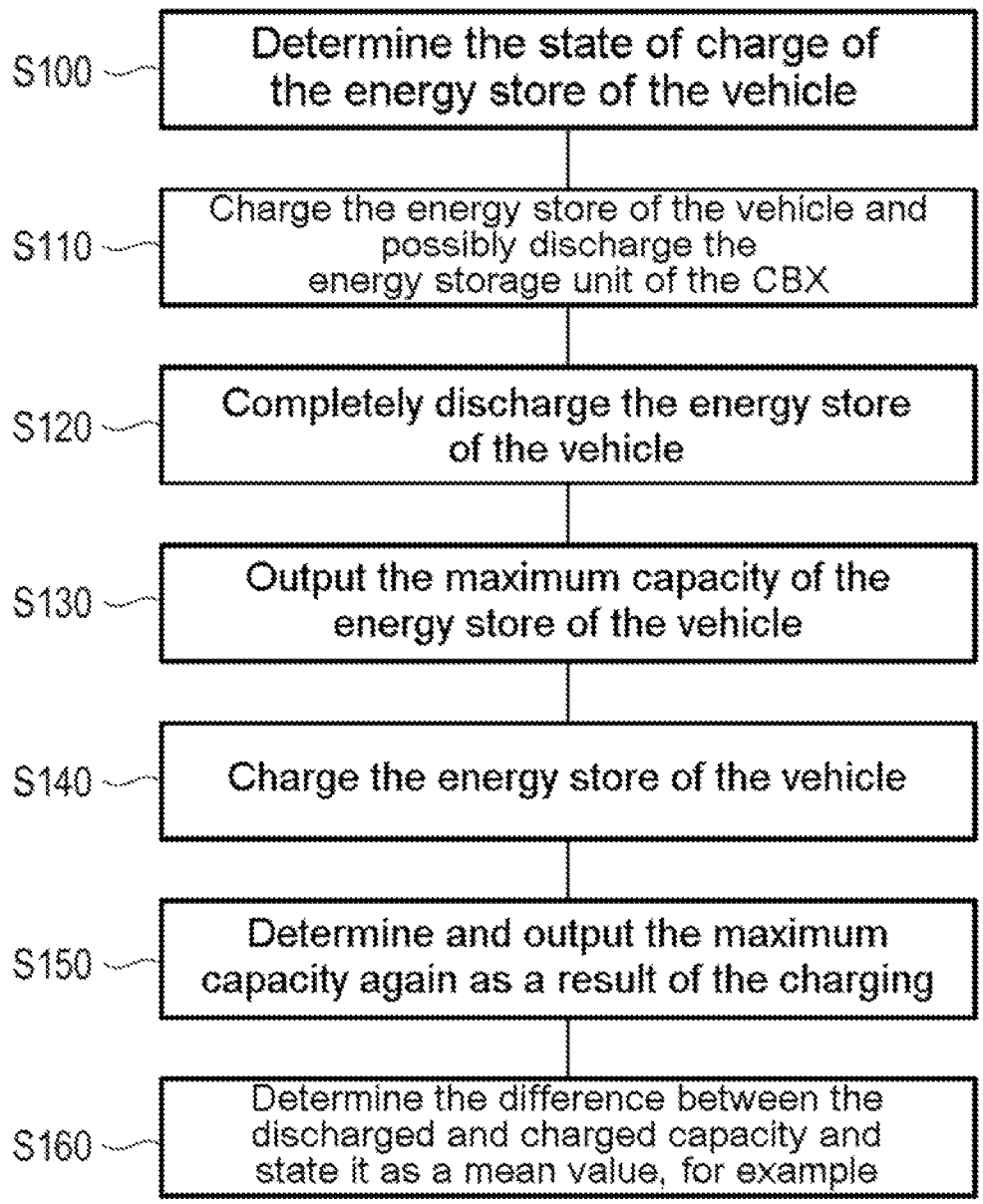

In the drawings:

FIG. 1 shows a schematic illustration of a charging device according to a first preferred embodiment with a charge box and two charging poles, wherein a vehicle with an electrical drive is connected to one of the charging poles, and FIG. 2 shows a flowchart of a method for determining a maximum storage capacity of an energy store of the vehicle from FIG. 1 for performance with the charging device from FIG. 1.

DETAILED DESCRIPTION OF THE INVENTION

FIG. 1 shows a charging device 10 according to the invention in accordance with a first preferred embodiment. The charging device 10 is designed for fast-charging with DC voltage and direct current.

In this exemplary embodiment, the charging device 10 comprises a charge box 12 which is connected to an energy network 14. The charge box 12 is designed to take electrical energy from the energy network 14 and to deliver electrical energy to the energy network 14. The energy network 14 is typically designed with AC voltage and alternating current.

In this exemplary embodiment, the charge box 12 comprises a cooling unit 16, power electronics 18 and an energy storage unit 20. The cooling unit 16 is used to control the temperature of the power electronics 18 and/or of the energy storage unit 20. The power electronics 18 convert electrical energy from the energy network 14 into a DC voltage/direct current. The power electronics 18 can also carry out a conversion in the opposite direction. The power electronics 18 can additionally convert DC voltage/direct current from the energy storage unit 20 for the purpose of fast-charging with DC voltage and direct current, that is to say can convert the level of the DC voltage and of the direct current.

In this exemplary embodiment, the charging device 10 comprises two charging poles 22 which are each connected to the charge box 12 via a connecting line 24. Accordingly, the charge box 12 is arranged between the energy network 14 and the two charging poles 22. The charging poles 22 are supplied with electrical energy for fast-charging with high DC voltages and direct currents by the charge box 12. The charging poles 22 can also be cooled by the cooling unit 16, including charging cables of the charging poles 22 for connection to a vehicle 26 to be charged, which is likewise illustrated in FIG. 1. In a particularly preferred embodiment, the charge box 12 comprises power electronics 18 for each of the two charging poles 22.

The vehicle 26 comprises an energy store 28 and a management unit 30. The vehicle 26 is connected to one of the charging poles 22 via a connection 32 which is indicated by an arrow in FIG. 1. As a result, it is possible to transfer electrical energy between the energy store 28 and the charge box 12 in both directions. The management unit 30 monitors the energy store 28 and, in addition to transferring energy, is communicatively connected to the charge box 12 via the connection 32.

In this exemplary embodiment, the energy store 28 and the energy storage unit 20 comprise a different number of battery cells. Accordingly, the energy storage unit 20 and the energy store 28 do not have the same maximum capacity. The capacity of the energy storage unit 20 is preferably greater than the capacity of the energy store 28. Deviations caused by component fluctuations of the battery cells and/or by aging processes of the battery cells can additionally arise. In this case, the battery cells can be connected, in principle, in parallel and/or in series in a different manner in order to achieve in each case a desired combination of maximum voltage and maximum current.

Accordingly, the charging device 10 can be used for the fast-charging of the energy store 28 which here is a drive battery of the vehicle 26 with an electrical drive.

A method for determining a maximum storage capacity of the energy store 28 of the vehicle 26 is described below with reference to FIG. 2. The method can be carried out using the above charging device 10.

The method begins with step S100 which relates to the determination of a state of charge of the energy store 28 of the vehicle 26. The state of charge of the energy store 28 of the vehicle 26 can be measured using the charging pole 22, for example. The state of charge is requested by means of communication with the management unit 30 via the connection 32.

Step S110 relates to charging of the energy store 28 until it reaches its maximum amount of charge. In this case, the separate energy storage unit 20 is discharged at the same time, and electrical energy delivered in this case is used to charge the energy store 28. The energy store 28 can be additionally charged with electrical energy from the energy network 14, for example via the charge box 12.

In step S120, the energy store 28 is preferably completely discharged using the separate energy storage unit 20 for receiving the charge of the energy store 28. In this case, an amount of charge transferred from the energy store 28 to the energy storage unit 20 and/or to the energy network 14 is captured.

The energy store 28 is discharged according to a defined discharging profile at ⅓ C, for example. The discharging is therefore carried out at a third of the maximum capacity of the energy store 28 per hour, with the result that the complete discharging of the energy store 28 is completed after approximately three hours. The energy store 28 is discharged taking into account the temperature. For this purpose, the vehicle 26 or only the energy store 28 can be brought to a suitable temperature in order to be able to reliably determine the maximum capacity of the energy store 28.

During complete discharging of the energy store 28, charge is first of all transferred from the energy store 28 to the separate energy storage unit 20 and is received there. On the basis of this, the electrical energy can be transferred from the energy storage unit 20 or, past the latter, on to the energy network 14. In addition, the charge of the energy store 28, which is received in the separate energy storage unit 20, can be converted via a consumer.

The consumer may be an auxiliary consumer of the charging device 10 or an internal consumer of the latter, for example the cooling unit 16.

In step S130, the maximum capacity of the energy store 28 is determined from the amount of charge transferred during complete discharging of the energy store 28 and is output. The maximum capacity of the energy store 28 is determined by an energy flow during the discharging of the energy store 28. For this purpose, a discharge current and a discharge voltage are measured, as a result of which the discharged amount of energy can be determined and the maximum capacity of the energy store 28 can therefore be inferred. The measurement can be carried out in the charge box 12. Alternatively or additionally, a DC meter installed in the charging pole 22, for example, can be used to measure the discharge current and the discharge voltage as immediately as possible.

In step S140, the energy store 28 is charged if possible/preferably using the separate energy storage unit 20. If the separate energy storage unit 20 does not have any energy or is defective, the charging operation can also be carried out solely from the energy network 14. Accordingly, electrical energy which is stored in the energy storage unit 20 is transferred to the energy store 28. If necessary, the energy store 28 can be additionally charged with electrical energy from the energy network 14.

In a further, optional step S150, the maximum capacity of the energy store 28 is determined again from the amount of charge transferred during complete charging of the energy store 28 and is output. The maximum capacity of the energy store 28 is determined by an energy flow during charging of the energy store 28. For this purpose, the charging current and charging voltage can be measured, as a result of which the charged amount of energy can be determined taking into account the charging time and the maximum capacity of the energy store 28 can therefore be inferred. The measurement can be carried out in the charge box 12. Alternatively or additionally, a current and/or voltage measuring device installed in the charging pole 22, for example, can be used to measure the charging current and the charging voltage as immediately as possible.

In a further, optional step S160, the charged capacity and the discharged capacity are compared and output, for example as individual values, a mean value and differences.

What is claimed:

1. A method for determining a maximum storage capacity of an energy store, in the form of a drive battery of a vehicle with an electrical drive, the method comprising the steps of:
   determining a state of charge of the energy store of the vehicle,
   charging the energy store until it reaches its maximum amount of charge,
   completely discharging the energy store using a separate energy storage unit for receiving the charge of the energy store, wherein a first amount of charge transferred from the energy store to the separate energy storage unit is captured,
   outputting the transferred amount of charge upon completely discharging the energy store, wherein the outputted transferred amount of charge is a discharging maximum capacity of the energy store, and
   following the complete discharging, recharging the energy store until it reaches its maximum amount of charge, wherein a second amount of charge transferred to the energy store during recharging is captured and outputted as a charging maximum capacity of the energy store.

2. The method as claimed in claim 1, further comprising charging the energy store using the separate energy storage unit for delivering charge to the energy store.

3. The method as claimed in claim 1, further comprising discharging the separate energy storage unit for charging the energy store.

4. The method as claimed in claim 1, wherein the complete discharging and/or the charging of the energy store using the separate energy storage unit for receiving/delivering the charge of the energy store comprise(s) charging/discharging the energy store according to a defined charging/discharging profile.

5. The method as claimed in claim 4, wherein the discharging and/or the charging of the energy store according to the defined charging/discharging profile comprises charging/discharging at ⅓ C.

6. The method as claimed in claim 1, wherein the complete discharging of the energy store using a separate energy storage unit for receiving the charge of the energy store comprises discharging the energy store while accounting for temperature.

7. The method as claimed in claim 1, wherein the complete discharging of the energy store using a separate energy storage unit for receiving the charge of the energy store comprises transferring charge from the energy storage unit to an energy network and/or directly transferring charge of the energy store to the energy network.

8. The method as claimed in claim 7, wherein the energy store is discharged directly into the energy network and/or is charged directly from the energy network.

9. The method as claimed in claim 8, wherein the energy network is a local home energy network.

10. The method as claimed in claim 9, wherein the complete discharging of the energy store using a separate energy storage unit for receiving the charge of the energy store comprises converting energy from the energy storage unit via a consumer and/or directly converting energy of the energy store via the consumer.

11. The method as claimed in claim 7, wherein the energy store is discharged in a parallel manner into the energy network and the energy storage unit and/or is charged in a parallel manner from the energy network and the energy storage unit.

12. The method as claimed in claim 7, wherein the determination of a state of charge of the energy store of the vehicle comprises measuring the state of charge of the energy store or requesting the state of charge of the energy store from a management unit of the energy store.

13. The method as claimed in claim 1, further comprising determining a difference between the discharging maximum capacity of the energy store and the charging maximum capacity of the energy store.

14. The method as claimed in claim 1, wherein at least one of the first amount of charge transferred from the energy store and the second amount of charge transferred to the energy store are determined by measuring a current and a voltage during the transfer and taking into account a time of the transfer.

15. A charging device for fast-charging an energy store, in the form of a drive battery of a vehicle with an electrical drive, the charging device comprising:
   a charging pole, and
   a charge box which is connected between an energy network and the charging pole and provides the charging pole with electrical energy for fast-charging with high DC voltages and direct currents, wherein the charge box has an energy storage unit, and
   wherein the charging device is configured to:
   (a) determine a state of charge of the energy store of the vehicle,
   (b) charge the energy store until it reaches its maximum amount of charge,
   (c) completely discharge the energy store using a separate energy storage unit for receiving the charge of the energy store, wherein an amount of charge transferred from the energy store to the separate energy storage unit is captured, and
   (d) output the transferred amount of charge upon completely discharging the energy store, wherein the outputted transferred amount of charge is the maximum capacity of the energy store.

* * * * *